United States Patent
Lee et al.

(10) Patent No.: US 9,648,757 B2
(45) Date of Patent: May 9, 2017

(54) METHOD FOR MANUFACTURING SPACE TRANSFORMER BY USING CARRIER SUBSTRATE MADE FOR CHIP PACKAGE AND PROVIDED WITH ELONGATED CONTACTS

(71) Applicant: MPI CORPORATION, Chu-Pei, Hsinchu Shien (TW)

(72) Inventors: Chung-Tse Lee, Chu-Pei (TW); Chien-Chou Wu, Chu-Pei (TW); Tsung-Yi Chen, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 272 days.

(21) Appl. No.: 14/520,772

(22) Filed: Oct. 22, 2014

(65) Prior Publication Data

US 2015/0107102 A1    Apr. 23, 2015

(30) Foreign Application Priority Data

Oct. 22, 2013 (TW) .............................. 102138165 A (51) Int. Cl.
*H05K 3/40* (2006.01)
*G01R 3/00* (2006.01)
(Continued)

(52) U.S. Cl.
CPC .......... *H05K 3/4007* (2013.01); *G01R 1/067* (2013.01); *G01R 1/20* (2013.01); *G01R 3/00* (2013.01); *H01R 43/20* (2013.01); *H05K 3/10* (2013.01); *H05K 3/143* (2013.01); *H05K 3/32* (2013.01); *H05K 3/403* (2013.01); *H05K 3/4038* (2013.01);
(Continued)

(58) Field of Classification Search
CPC  H05K 3/10; H05K 3/143; H05K 3/32; H05K 3/4007; H05K 3/403; H05K 3/4038; H05K 2203/0574; H05K 2203/1476; H05K 2201/09409; G01R 1/067; G01R 1/07378; G01R 1/20; G01R 3/00; H01R 43/20;
(Continued)

(56) References Cited

U.S. PATENT DOCUMENTS 7,674,362 B2 *    3/2010   Hu ....................... H05K 3/4007
                                                           205/125
2008/0093115 A1 *  4/2008   Lee ................... Y10T 29/49165
                                                           174/261

FOREIGN PATENT DOCUMENTS

JP          2009060144 A    *   3/2009

* cited by examiner

*Primary Examiner* — A. Dexter Tugbang
(74) *Attorney, Agent, or Firm* — Muncy, Geissler, Olds & Lowe, P.C.

(57) ABSTRACT

A method of manufacturing a space transformer includes providing a carrier substrate made for a chip package, forming an insulated layer disposed on the carrier substrate, and forming a conductive block. The carrier substrate is formed with elongated first and second wires. The first wire has an elongated contact which is longer than the width of the first wire. The insulated layer is formed with a hole corresponding in position to the elongated contact. The conductive block is formed with an elongated connecting column located in the hole and connected with the elongated contact, and a cylindrical contact pad exposed at the outside of the insulated layer, larger-sized than the elongated connecting column is connected with the elongated connecting column. As a result, the cylindrical contact pad has sufficient area and structural strength for contact with a probe needle.

6 Claims, 8 Drawing Sheets

(51) Int. Cl.
  *H05K 3/14*     (2006.01)
  *H05K 3/10*     (2006.01)
  *H05K 3/32*     (2006.01)
  *G01R 1/067*    (2006.01)
  *G01R 1/20*     (2006.01)
  *H01R 43/20*    (2006.01)
  *G01R 1/073*    (2006.01)

(52) U.S. Cl.
  CPC ............... *G01R 1/07378* (2013.01); *H05K 2201/09409* (2013.01); *H05K 2203/0574* (2013.01); *H05K 2203/1476* (2013.01); *Y10T 29/49147* (2015.01); *Y10T 29/49162* (2015.01); *Y10T 29/49165* (2015.01)

(58) Field of Classification Search
  CPC ......... Y10T 29/49147; Y10T 29/49162; Y10T 29/49165
  See application file for complete search history.

METHOD FOR MANUFACTURING SPACE TRANSFORMER BY USING CARRIER SUBSTRATE MADE FOR CHIP PACKAGE AND PROVIDED WITH ELONGATED CONTACTS

BACKGROUND OF THE INVENTION

1. Field of the Invention

The present invention relates generally to space transformers for being used in probe cards and more particularly, to a space transformer using a carrier substrate which is originally made for a chip package and provided with elongated contacts, and to a method for manufacturing the space transformer.

2. Description of the Related Art

A probe card usually comprises a main circuit board adapted to be electrically connected with signal-transmitting contacts of a testing apparatus directly, and a space transformer (hereinafter referred to as "ST") mounted to a bottom surface of the main circuit board. The space transformer is provided at a top surface thereof with a plurality of top contact pads adapted for being electrically connected with the main circuit board, and at a bottom surface thereof with a plurality of bottom contact pads adapted for being connected with a plurality of probe needles, such as vertical probe needles, respectively. The space transformer is designed in such a way that the bottom contact pads of the space transformer are arranged having an interval smaller than the interval of the top contact pads of the space transformer, so that the probe needles, which are connected with the bottom contact pads, will be also arranged with a relatively smaller interval and thereby capable of probing contact pads of a chip having a very small interval too.

For general vertical probe cards, the bottom contact pads of the space transformer are arranged conforming in position to the contact pads of the chip under test, so that the probe needles, which are connected with the bottom contact pads, will also conform in position to the contact pads of the chip under test. For lowering the manufacturing cost of the space transformer and avoiding positional deviations of the bottom contact pads of the space transformer, many commercially available probe cards use carrier substrates originally made for chip packages to serve as the space transformers. The carrier substrate, which is provided by a chip manufacturing or designing dealer to a probe card manufacturer, has an original usage of connecting a chip to a circuit board. This means the carrier substrate is originally configured with contacts corresponding in pattern to the contact pads of the chip, such that the chip can be directly and electrically bonded on the carrier substrate in a chip package. Therefore, the pattern of the contacts of the carrier substrate doesn't need to be reformed or rearranged if the carrier substrate, which is originally used in a chip package, is directly applied in the probe card for testing the chips having contact pad pattern corresponding to the contact pattern of the carrier substrate to serve as the space transformer of the probe card.

When applying the carrier substrate made for the chip package to the probe card, the probe card manufacturer mounts additional circular contact pads on the original contacts of the carrier substrate. The additional circular contact pads have relatively larger thickness and area so that the space transformer made of the carrier substrate has the reinforced contact pads with high structural strength for being contacted by the probe needles. In this way, the contact pads of the space transformer are less damageable by reacting force from the chip probed by the probe needles.

For applications in high-grade electronic devices, the chip package is developed smaller and smaller. If the carrier substrate made with reduced size for a small chip package has circular contacts with correspondingly reduced size, the circular contacts might be too small to be connected with the chip firmly. Therefore, the commercially available carrier substrates with relatively smaller size are usually provided with elongated contacts. Although the elongated contact of the small-sized carrier substrate is also very narrow, it is long enough to have sufficient area for being connected with the chip firmly.

However, the carrier substrate made for the chip package with elongated contacts is difficult to be made as the space transformer of the probe card by the conventional way of mounting large-sized circular contact pads to the original elongated contacts of the carrier substrate due to limit of the very small interval between the adjacent elongated contacts. That is, the adjacent elongated contacts will be short-circuited by the large-sized circular contact pads unless the area of each circular contact pad is reduced; however, the circular contact pads with reduced area will have insufficient structural strength.

SUMMARY OF THE INVENTION

The present invention has been accomplished in view of the above-noted circumstances. It is an objective of the present invention to provide a space transformer using a carrier substrate made for a chip package with elongated contacts and a method for manufacturing the same. The space transformer thus obtained has cylindrical contact pads mounted on the elongated contacts of the carrier substrate and having sufficient area and structural strength without short-circuiting adjacent wires.

To attain the above objective, the present invention provides a space transformer which comprises a carrier substrate, an insulated layer and a conductive block. The carrier substrate is made for a chip package and provided with a first wire having an elongated contact, and a second wire adjacent to the first wire. The insulated layer is disposed on the carrier substrate and provided with a hole corresponding to the elongated contact. The conductive block has an elongated connecting column located in the hole of the insulated layer and connected with the elongated contact of the first wire, and a cylindrical contact pad connected with the elongated connecting column and having at least a part exposed at an outside of the insulated layer for being contacted with a contact end of a probe needle. The cylindrical contact pad is defined with a diameter D. The first wire is defined with a width $L_1$. The first and second wires are defined with a distance $L_2$ therebetween. The elongated contact is defined with a length $L_3$. The diameter D, the width $L_1$, the distance $L_2$ and the length $L_3$ satisfy the inequalities of:

$L_3 > L_1$;

$D > L_3$;

and $D/2 > L_1/2 + L_2$.

To attain the above objective, the present invention provides a method for manufacturing a space transformer comprising steps of:

(a) providing a carrier substrate which is made for a chip package and provided with a first wire having an elongated contact, and a second wire adjacent to the first wire, the first wire being defined with a width $L_1$, the first and second wires being defined with a distance $L_2$ therebetween, the elongated contact being defined with a length $L_3$, the width $L_1$ and the length $L_3$ satisfying an inequality of:

$$L_3 > L_1;$$

(b) forming a lower insulated layer which is disposed on the carrier substrate and provided with a lower void corresponding in position and shape to the elongated contact by photolithography;

(c) forming an elongated connecting column which is located in the lower void and connected with the elongated contact of the first wire;

(d) forming an upper insulated layer which is disposed on the lower insulated layer and provided with an upper void corresponding in position to the elongated connecting column by photolithography, the upper void being cylindrical-shaped and larger-sized than the elongated connecting column; and (e) forming a cylindrical contact pad which is located in the upper void and connected with the elongated connecting column for being contacted with a contact end of a probe needle, the contact end of the probe needle being defined with a radius R, the cylindrical contact pad being defined with a diameter D, the diameter D, the radius R, the width $L_1$, the distance $L_2$ and the length $L_3$ satisfying the inequalities of:

$$D > 2R;$$

$$D > L_3;$$

and $$D/2 > L_1/2 + L_2.$$

As a result, the cylindrical contact pad has so sufficient area and structural strength as to be not easily damaged. Besides, the cylindrical contact pad is separated from the carrier substrate by the insulated layer; therefore, even if the cylindrical contact pad has so large area as to be partially located above the second wire, the first and second wires will not be connected electrically by the cylindrical contact pad and thereby will not be short-circuited.

Preferably, in the aforesaid space transformer and method, the width $L_1$ of the first wire substantially equals to the distance $L_2$ between the first and second wires; in other words, the width $L_1$ and the distance $L_2$ comply with an equation of:

$$L_1 = L_2.$$

Preferably, the aforesaid method comprises a further step of removing a part or a whole of the upper insulated layer after the step (e) so as to expose a peripheral of the cylindrical contact pad partially or completely. That means the space transformer may not have any of the upper insulated layer; alternatively, it may have a part of the upper insulated layer or the whole upper insulated layer so that the cylindrical contact pad of the conductive block is surrounded by the upper insulated layer and thereby strengthened in its structure.

Preferably, the aforesaid method comprises a further step of coating the cylindrical contact pad with an antioxidant layer after the step (e). That means the cylindrical contact pad of the conductive block of the space transformer may further has an antioxidant layer.

Preferably, in the aforesaid space transformer and method, the elongated connecting column and the cylindrical contact pad are formed by electroplating, vapor deposition, or sputtering deposition.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
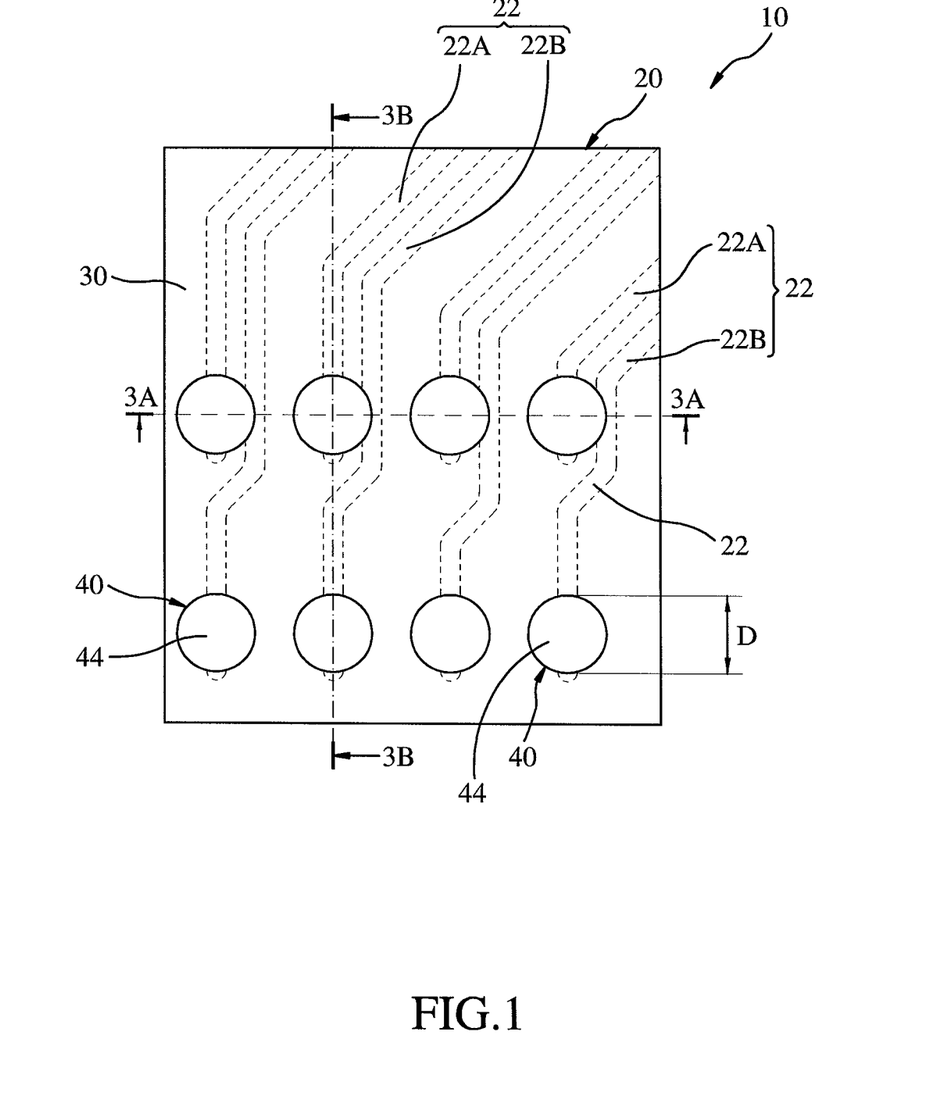
FIG. 1 is a schematic plane view of a part of a space transformer using a carrier substrate made for a chip package with elongated contacts according to a first preferred embodiment of the present invention.
Figure 2A:
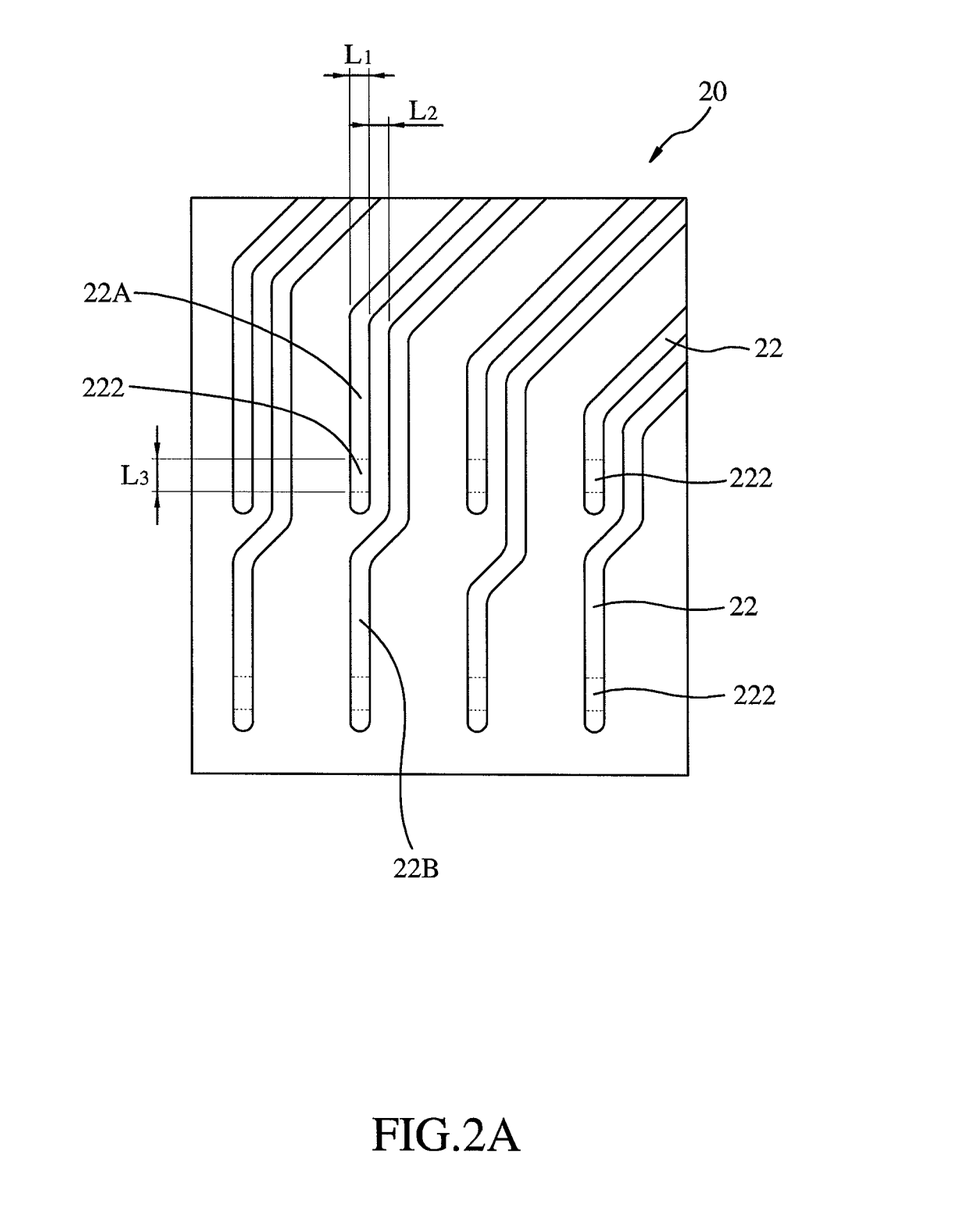
FIG. 2A is a schematic plane view of the carrier substrate of the space transformer shown in FIG. 1.
Figure 3A:
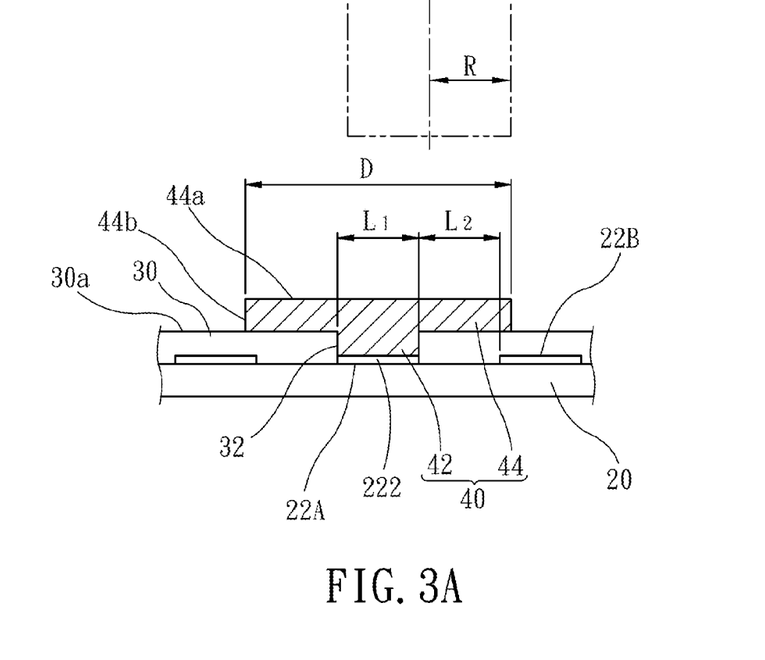
FIG. 3A is a schematic sectional view taking along the line 3A-3A in FIG. 1.
Figure 3B:
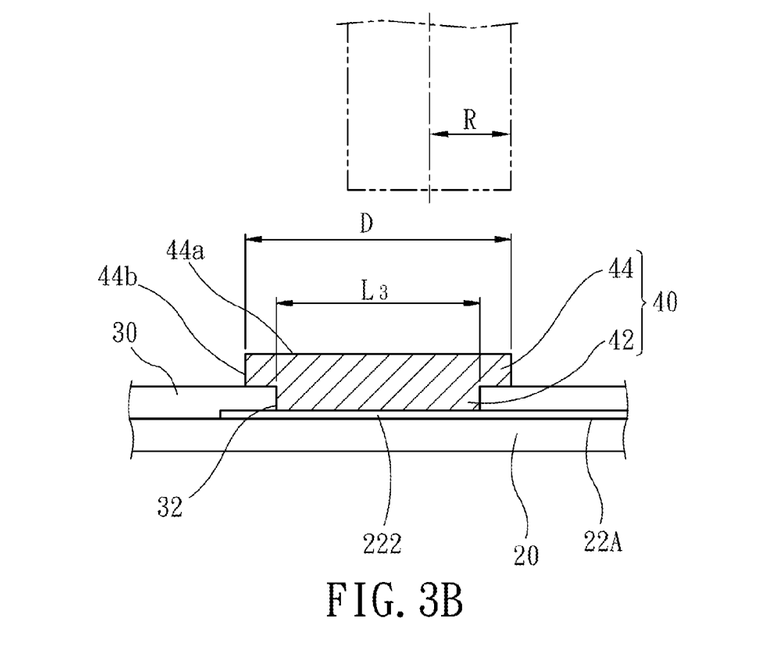
FIG. 3B is a schematic sectional view taking along the line 3B-3B in FIG. 1.

Referring to FIGS. 1 to 3B, a space transformer 10 according to a first preferred embodiment of the present invention comprises a carrier substrate 20. FIG. 1 is a schematic plane view of a part of the space transformer 10, meaning that the space transformer 10 is not completely shown in FIG. 1. FIG. 2A is a schematic plane view of the carrier substrate 20. FIG. 3A and FIG. 3B are schematic sectional views of the space transformer 10. As shown in FIG. 1, FIG. 3A and FIG. 3B, the space transformer 10 further comprises an insulated layer 30 disposed on the carrier substrate 20, and a plurality of conductive blocks 40 each having at least a part exposed at the outside of the insulated layer 30. It is to be mentioned that FIG. 1, wherein eight conductive blocks 40 are shown, actually illustrates the space transformer 10 partially, as described before; therefore, the amount of the conductive blocks 40 is not limited to that of this embodiment. For the convenience of illustration, only one of the conductive blocks 40 is shown in FIG. 3A and FIG. 3B.

As shown in the figures, the carrier substrate 20 is provided with a plurality of elongated wires 22 including at least a first wire 22A having an elongated contact 222 and a second wire 22B adjacent to the first wire 22A and maybe having an elongated contact 222 as well. The positional arrangement of the elongated contacts 222 corresponds to the positional arrangement of contact pads of a device under test and is not limited to that shown in FIG. 2A, but, for instance, can be configured as shown in FIG. 2B. In addition, the insulated layer 30 is provided with a hole 32 corresponding to the elongated contact 222 of the first wire 22A. The conductive block 40 has an elongated connecting column 42 located in the hole 32 and connected with the elongated contact 222 of the first wire 22A, and a cylindrical contact pad 44 connected with the elongated connecting column 42 for being contacted with a probe needle (not shown). The cylindrical contact pad 44 has a contact surface 44a and a peripheral 44b, and the contact surface 44a is adapted for being contacted with the probe needle. In this embodiment, an outside surface 30a of the insulated layer 30 is lower than the contact surface 44a of the cylindrical contact pad 44 in such a way that the peripheral 44b of the cylindrical contact pad 44 is completely exposed at the outside of the insulated layer 30.

Figure 4A:
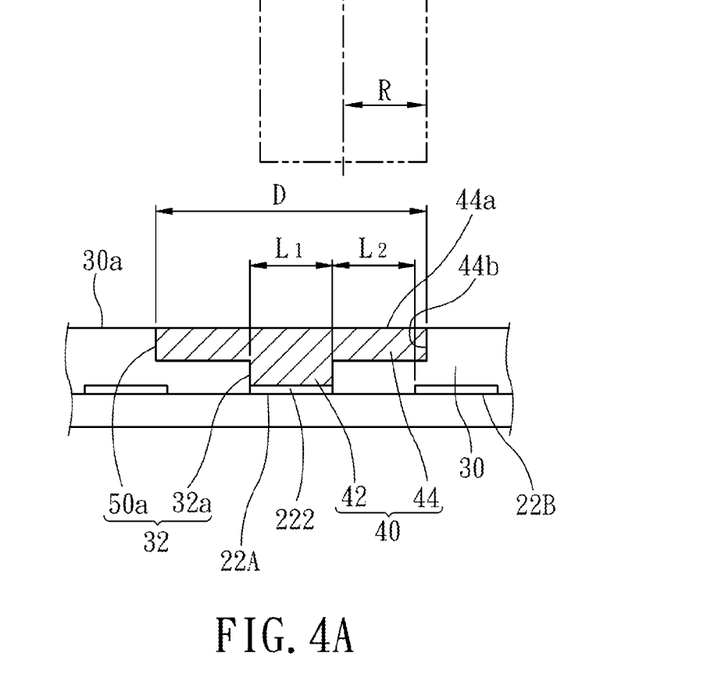
FIG. 4A is a schematic sectional view of a space transformer according to a second preferred embodiment of the present invention.
Figure 4B:
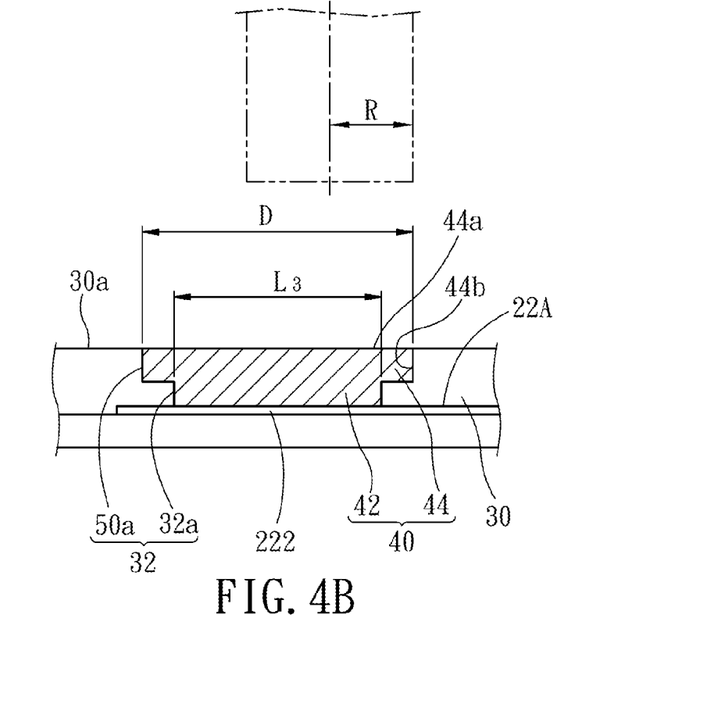
FIG. 4B is another schematic sectional view of the space transformer according to the second preferred embodiment of the present invention.

In fact, the insulated layer 30 can be configured covering a part or a whole of the peripheral 44b of the cylindrical contact pad 44, such as a space transformer according to a second preferred embodiment of the present invention shown in FIG. 4A and FIG. 4B. In this embodiment, the outside surface 30a of the insulated layer 30 is substantially flush with the contact surface 44a of the cylindrical contact pad 44. The hole 32 of the insulated layer 30 has a lower void 32a accommodating the elongated connecting column 42, and an upper void 50a communicating with the lower void 32a and accommodating the cylindrical contact pad 44. In this way, the peripheral 44b of the cylindrical contact pad 44 is surrounded by the insulated layer 30 so that the cylindrical contact pad 44 will be in contact with the probe needle relatively firmer.

The method for manufacturing the space transformer 10 is illustrated in FIGS. 5-11. The steps of the method will be specified in the following paragraphs; at the same time, the structure of the space transformer 10 will be further described. The method for manufacturing the space transformer 10 comprises the following steps.

Figure 2B:
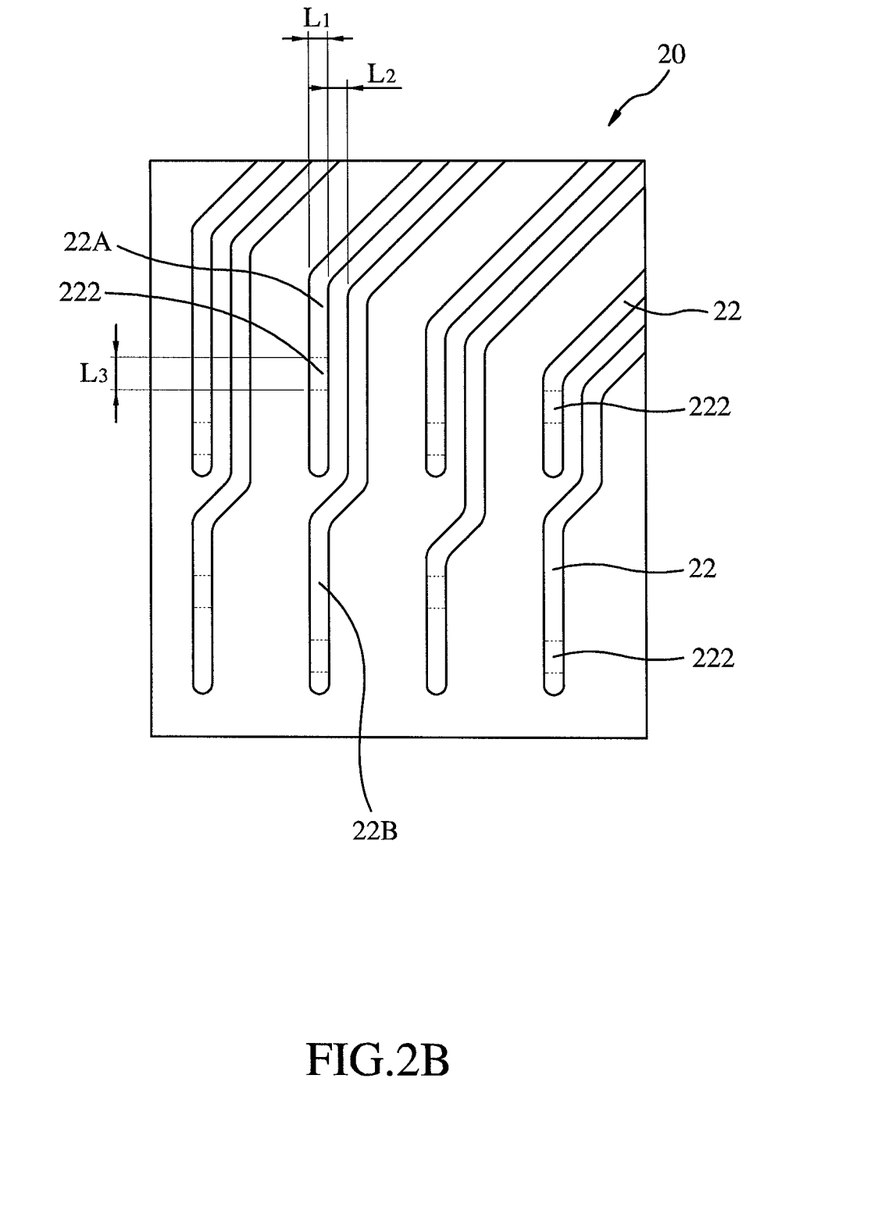
FIG. 2B is similar to FIG. 2A except the positions of the elongated contacts.
Figure 5:
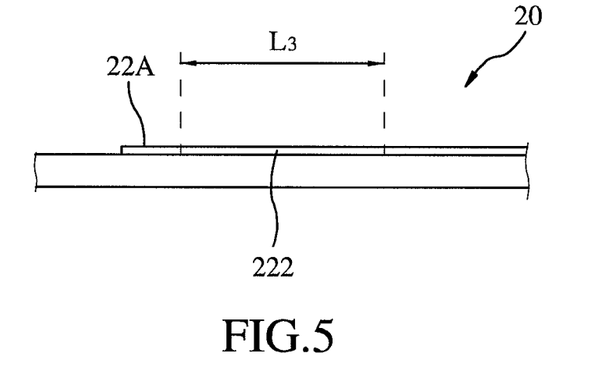
FIGS. 5-11 are schematic sectional views illustrating steps of a method for manufacturing the space transformer according to the first or second preferred embodiment of the present invention.

(a) As shown in FIG. 2A and FIG. 5, provide a carrier substrate 20 which is made for a chip package and provided with an elongated first wire 22A having an elongated contact 222, and an elongated second wire 22B adjacent to the first wire 22A. The first wire 22A is defined with a width $L_1$. The first and second wires 22A, 22B are defined with a distance $L_2$ therebetween. The elongated contact 222 is defined with a length $L_3$. The width $L_1$ and the length $L_3$ satisfy an inequality of:

$$L_3 > L_1.$$

Specifically speaking, the carrier substrate 20 has an original usage of connecting a chip (not shown) to a circuit board (not shown) when the chip is packaged. In general, the carrier substrate 20 is provided with a plurality of wires 22 including a plurality of pairs of adjacent first and second wires 22A, 22B. The wires 22 may have different functions of transmitting signals, grounding, and transmitting power. Each wire 22 is selectively provided at a specific region thereof with an elongated contact 222. In fact, the carrier substrate 20 has an insulated layer (not shown) covering the wires 22 almost completely but having a plurality of elongated openings on specific regions of specific wires 22 so that the specific regions of the specific wires 22 are exposed through the elongated openings of the insulated layer and thereby able to be connected with an electronic element, such as a chip. The present invention refers to the aforesaid exposed specific regions of the specific wires 22 as the elongated contacts 222. The elongated contacts 222 are arranged corresponding in shape and position to contact pads of the aforesaid chip to be connected with the carrier substrate 20; in other words, the contact pad of the chip also has an elongated shape with a length $L_3$ and a width $L_1$. For the carrier substrate 20 to be made as the space transformer 10 of the present invention, the contact 222 should be shaped in a way that the length $L_3$ of the contact 222 is longer than the width $L_1$ of the wire 22, i.e. the contact 222 is configured to be elongated. In this way, even if the wires of the carrier substrate are shaped very thin and arranged very densely so as to fit in with the current trend of chip packages, the contact of each wire still has sufficient area for connection with the chip.

Figure 6:
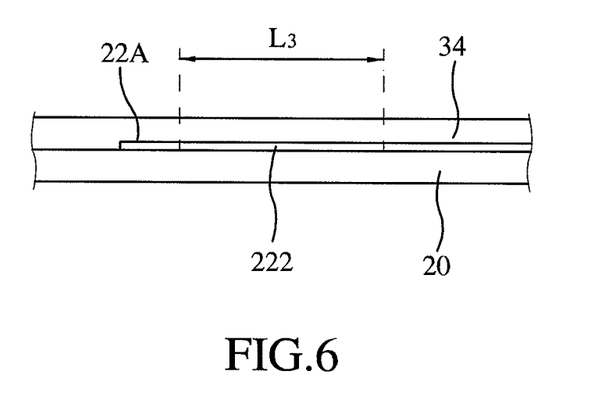
Figure 7:
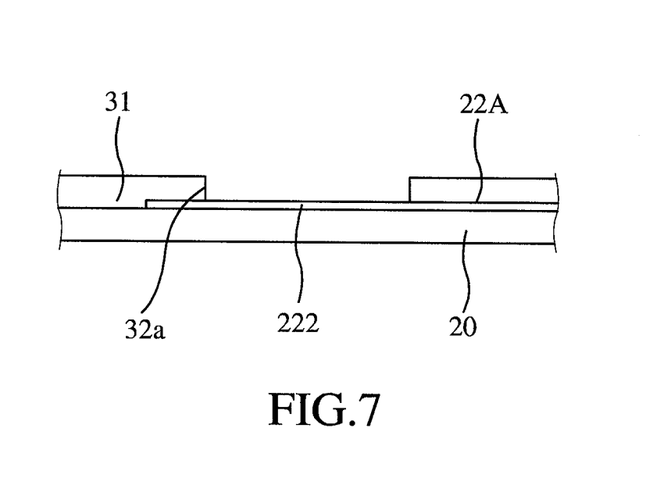

(b) As shown in FIGS. 6-7, form a lower insulated layer 31 which is disposed on the carrier substrate 20 and provided with a lower void 32a by photolithography so that the elongated contact 222 is exposed through the lower void 32a.

Specifically speaking, this step is carried out by coating the carrier substrate 20 with an insulated photoresist layer 34 (shown in FIG. 6) covering the wires 22, then exposing the insulated photoresist layer 34 to UV light passing through a mask (not shown) with a pattern corresponding to the elongated contacts 222, and finally developing the insulated photoresist layer 34 to remove the parts of the insulated photoresist layer 34 corresponding to the elongated contacts 222 so as to form the lower insulated layer 31 having a plurality of lower voids 32a. The lower voids 32a are arranged corresponding in shape and position to the elongated contacts 222 so that the elongated contacts 222 are exposed through the lower voids 32a. The aforesaid photolithography and the materials of photoresist are well-known and practicable to those skilled in the art of semiconductor manufacturing process and therefore only briefly introduced as above.

Figure 8:
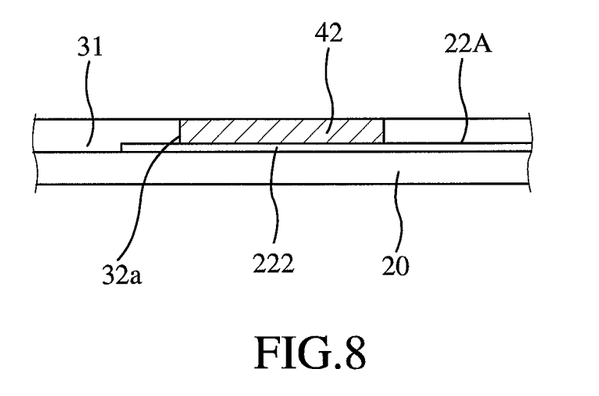

(c) As shown in FIG. 8, form an elongated connecting column 42 which is located in the lower void 32a and connected with the elongated contact 222 of the first wire 22A. This step is carried out by electroplating, vapor deposition, or sputtering deposition so that the elongated connecting column 42, which is made of metal deposited in the lower void 32a, is structurally and electrically connected with the elongated contact 222 and has a shape conforming to the lower void 32a and a predetermined height. In practice, after the elongated connecting column 42 is formed, an optional step of flattening can be done to adjust the height of the elongated connecting column 42 to the extent that the top surface of the lower insulated layer 31 is flush with the top surface of the elongated connecting column 42 for the sake of the following steps. The aforesaid step of flattening can, but not limited to, be carried out by the conventional chemical-mechanical planarization technique.

Figure 9:
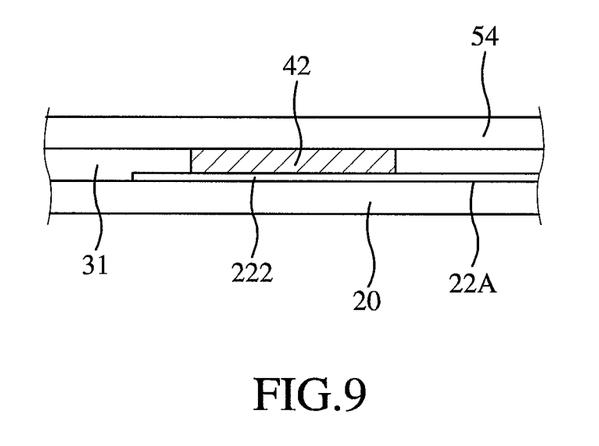
Figure 10:
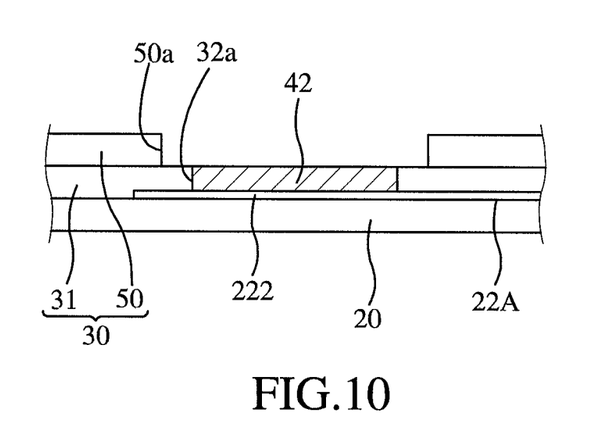

(d) As shown in FIGS. 9-10, form an upper insulated layer 50 which is disposed on the lower insulated layer 31 and provided with an upper void 50a corresponding in position to the elongated connecting column 42 by photolithography.

The upper void 50a is cylindrical-shaped and larger-sized than the elongated connecting column 42.

Specifically speaking, this step is carried out by coating the lower insulated layer 31 with an insulated photoresist layer 54 covering the elongated connecting column 42 as shown in FIG. 9, then exposing the insulated photoresist layer 54 to UV light passing through another mask (not shown), and finally developing the insulated photoresist layer 54 to remove the parts of the insulated photoresist layer 54 corresponding to the elongated connecting column 42 so as to form the upper insulated layer 50 having the upper void 50a. The material of the insulated photoresist layer 54 can be the same or different from the material of the aforesaid insulated photoresist layer 34 in the step (b). The upper void 50a, which communicates with the lower void 32a, is larger-sized than the lower void 32a and cylindrical-shaped with predetermined width and diameter.

Figure 11:
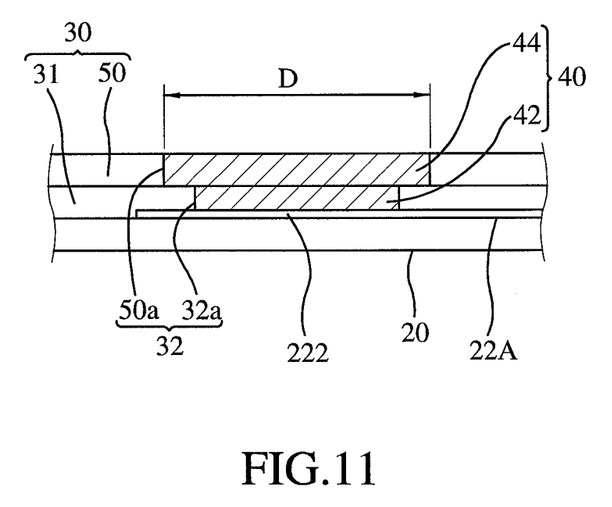

(e) As shown in FIG. 11, form a cylindrical contact pad 44 which is located in the upper void 50a and connected with the elongated connecting column 42 structurally and electrically. This step is carried out by electroplating, vapor deposition, or sputtering deposition so that the cylindrical contact pad 44, which is made of metal, is deposited in the upper void 50a. After the cylindrical contact pad 44 is formed, it can also be further adjusted the height thereof by an optional step of flattening which can, but not limited to, be carried out by the conventional chemical-mechanical planarization technique.

As a result, the conductive block 40 composed of the elongated connecting column 42 and the cylindrical contact pad 44 is formed on the elongated contact 222 of the first wire 22A and electrically connected with the elongated contact 222. The top surface, i.e. the contact surface 44a, of the cylindrical contact pad 44 is adapted for being contacted with a contact end of a probe needle (not shown) so that the first wire 22A is able to be electrically connected with the probe needle. When this step is completed as shown in FIG. 11, the lower insulated layer 31 and the upper insulated layer 50 combinedly form the insulated layer 30 as illustrated in FIG. 4B. At the same time, the lower void 32a and the upper void 50a combinedly form the hole 32 as illustrated in FIG. 4B. In other words, the space transformer according to the second preferred embodiment of the present invention as shown in FIG. 4A and FIG. 4B is accomplished in this step.

The contact end of the probe needle is defined with a radius R, as shown in FIGS. 3A, 3B, 4A and 4B. The cylindrical contact pad 44 is defined with a diameter D. The diameter D, the radius R, the width $L_1$, the distance $L_2$ and the length $L_3$ shall satisfy the inequalities of:

$$D>2R;$$

$$D>L_3;$$

and $$D/2>L_1/2+L_2.$$

In other words, the diameter D of the cylindrical contact pad 44 is greater than the diameter of the contact end of the probe needle, so that the probe needle will be in contact with the cylindrical contact pad 44 reliably. In this way, bad signal-transmitting effects resulted from uncertain contact between the probe needle and the cylindrical contact pad will be avoided. Besides, the diameter D of the cylindrical contact pad 44 is greater than the length $L_3$ of the elongated contact 222, as shown in FIG. 3B, so that the elongated contact 222 and the elongated connecting column 42 are completely covered by the cylindrical contact pad 44, and the cylindrical contact pad 44 has relatively larger area for contact with the probe needle. Further, the radius of the cylindrical contact pad 44, i.e. D/2, is greater than the sum of half the width of the first wire $L_1/2$ and the distance $L_2$ between the first and second wires 22A, 22B, as shown in FIG. 3A, so that the cylindrical contact pad 44 extends from the top of the elongated connecting column 42 to the position above the second wire 22B, meaning that the cylindrical contact pad 44 can be disposed above the second wire 22B partially. In this way, even if the wires 22 of the carrier substrate 20 are shaped relatively thinner and arranged relatively denser, the cylindrical contact pad 44, which is disposed on the first wire 22A and able to extend to the position above the second wire 22B, will still have sufficient area and structural strength for contact with the probe needle.

Practically, in addition to the elongated contact 222 of the first wire 22A, each of the other elongated contacts 222 of the carrier substrate 20 is connected with a conductive block 40 formed in the process of the aforesaid method. The cylindrical contact pads 44 of the conductive blocks 40 basically have the same size which is determined by choosing one of the wires 22 to serve as the aforesaid first wire 22A and adopting the aforesaid inequalities, so that the cylindrical contact pads 44 of the space transformer 10 for contact with probe needles all have sufficient structural strength and therefore are not easily damaged. Besides, the cylindrical contact pads 44 are separated from the carrier substrate 20 by the insulated layer 30; therefore, even if the cylindrical contact pads 44 are so large that each cylindrical contact pad 44 is located above two or more adjacent wires, the cylindrical contact pads 44 can be arranged in a staggered manner as shown in FIG. 1, so that every two adjacent wires will not be electrically connected with the same cylindrical contact pad, thereby preventing short circuit therebetween.

Figure 12:
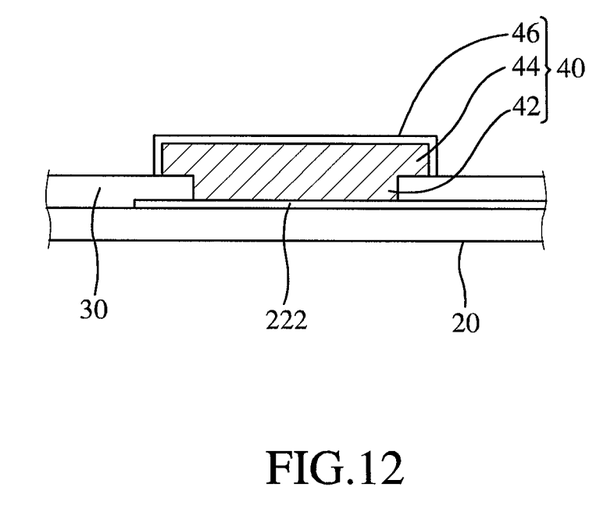
FIG. 12 is similar to FIG. 3B except that a conductive block of the space transformer in FIG. 12 additionally has an antioxidant layer.

The aforesaid method may comprise a further step of removing a part or a whole of the upper insulated layer 50 after the step (e). Before this step, the exposed part of the cylindrical contact pad 44 is only the contact surface 44a thereof. After this step, the peripheral 44b of the cylindrical contact pad 44 is partially or completely exposed at the outside of the insulated layer 30 as well. For example, FIG. 3A, FIG. 3B and FIG. 12 show the situation that the upper insulated layer 50 is completely removed; in this situation, the lower insulated layer 31 and the lower void 32a shown in FIG. 11 are respectively referred to as the insulated layer 30 and the hole 32 in FIG. 3A and FIG. 3B. In other words, the space transformer 10 according to the first preferred embodiment of the present invention as shown in FIGS. 1-3B is accomplished in this step. However, it is to be mentioned again that the method for manufacturing the space transformer may omit such step of removing the upper insulated layer 50 partially or completely so as to retain the upper insulated layer 50 partially or completely to hold the peripheral 44b of the cylindrical contact pad 44.

Besides, the aforesaid method may comprise a further step of coating the cylindrical contact pad 44 with an antioxidant layer 46 after the step (e), as shown in FIG. 12. The antioxidant layer 46 can be selectively provided on the contact surface 44a or the peripheral 44b as well, so as to prevent the metallic cylindrical contact pad 44 from rustiness. The antioxidant layer 46 can be made of wear-resisting metal so that the cylindrical contact pad 44 will be relatively more durable.

In the aforesaid embodiments, the carrier substrate 20 of the space transformer 10 may, but not limited to, comply with an equation of:

$$L_1 = L_2.$$

That is, the width $L_1$ of the first wire 22A equals to the distance $L_2$ between the first and second wires 22A, 22B. In this way, under the condition that the carrier substrate 20 is provided with relatively denser and thinner wires 22, the diameter of the cylindrical contact pad 44 is greater than triple of the width of the first wire 22A as shown in FIG. 3A, so that the cylindrical contact pad 44 has sufficient contact area.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a space transformer, comprising steps of:
   (a) providing a carrier substrate which is made for a chip package and provided with a first wire having an elongated contact, and a second wire adjacent to the first wire, the first wire being defined with a width $L_1$, the first and second wires being defined with a distance $L_2$ between the first and second wires, the elongated contact being defined with a length $L_3$, the width $L_1$ and the length $L_3$ satisfying an inequality of:

$$L_3 > L_1;$$

(b) forming a lower insulated layer which is disposed on the carrier substrate and provided with a lower void corresponding in position and shape to the elongated contact by a photolithography process;
   (c) forming an elongated connecting column which is located in the lower void and connected with the elongated contact of the first wire;
   (d) forming an upper insulated layer which is disposed on the lower insulated layer and provided with an upper void corresponding in position to the elongated connecting column by another photolithography process, the upper void being cylindrical-shaped and larger-sized than the elongated connecting column; and
   (e) forming a cylindrical contact pad which is located in the upper void and connected with the elongated connecting column for being contacted with a contact end of a probe needle, the contact end of the probe needle being defined with a radius R, the cylindrical contact pad being defined with a diameter D, the diameter D, the radius R, the width $L_1$, the distance $L_2$ and the length $L_3$ satisfying inequalities of:

$$D > 2R;$$

$$D > L_3; \text{ and}$$

$$D/2 > L_1/2 + L_2.$$

2. The method as claimed in claim 1, wherein the width $L_1$ of the first wire substantially equals to the distance $L_2$ between the first and second wires.

3. The method as claimed in claim 1, further comprising a step of removing a part or a whole of the upper insulated layer after forming the cylindrical contact pad so as to expose a peripheral of the cylindrical contact pad partially or completely.

4. The method as claimed in claim 3, further comprising a step of coating the cylindrical contact pad with an anti-oxidant layer after forming the cylindrical contact pad.

5. The method as claimed in claim 1, further comprising a step of coating the cylindrical contact pad with an anti-oxidant layer after forming the cylindrical contact pad.

6. The method as claimed in claim 1, wherein the elongated connecting column and the cylindrical contact pad are formed by electroplating, vapor deposition, or sputtering deposition.

* * * * *